US009698384B2

(12) United States Patent
Xu et al.

(10) Patent No.: US 9,698,384 B2
(45) Date of Patent: Jul. 4, 2017

(54) ORGANIC LIGHT EMITTING DIODE DISPLAY PANEL AND ITS MANUFACTURING METHOD, DISPLAY DEVICE

(71) Applicant: BOE TECHNOLOGY GROUP CO., LTD., Beijing (CN)

(72) Inventors: Xiaowei Xu, Beijing (CN); Lei Shi, Beijing (CN); Wenqing Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/769,427

(22) PCT Filed: Dec. 3, 2014

(86) PCT No.: PCT/CN2014/092861
§ 371 (c)(1),
(2) Date: Aug. 20, 2015

(87) PCT Pub. No.: WO2016/033885
PCT Pub. Date: Mar. 10, 2016

(65) Prior Publication Data
US 2016/0254496 A1    Sep. 1, 2016

(30) Foreign Application Priority Data
Sep. 5, 2014 (CN) .......................... 2014 1 0454171

(51) Int. Cl.
*H01L 51/56* (2006.01)
*H01L 51/52* (2006.01)
*H01L 27/32* (2006.01)

(52) U.S. Cl.
CPC ...... *H01L 51/5275* (2013.01); *H01L 27/3246* (2013.01); *H01L 51/56* (2013.01);
(Continued)

(58) Field of Classification Search
CPC . H01L 51/56; H01L 51/5268; H01L 51/5275; H01L 27/3246; H01L 27/3248
See application file for complete search history.

(56) References Cited

U.S. PATENT DOCUMENTS

2006/0097631 A1*  5/2006  Lee ..................... H01L 51/5203
                                                313/504
2010/0052519 A1*  3/2010  Jeon .................... H01L 27/3246
                                                313/504
(Continued)

FOREIGN PATENT DOCUMENTS

CN    102082166 A    6/2011
CN    103500754 A    1/2014
(Continued)

OTHER PUBLICATIONS

First Office Action regarding Korean application No. 10-2015-7023326, dated Aug. 27, 2015. Translation provided by Dragon Intellectual Property Law Firm.
(Continued)

*Primary Examiner* — Phuc Dang
(74) *Attorney, Agent, or Firm* — Harness, Dickey & Pierce, P.L.C.

(57) ABSTRACT

Provided are an OLED display panel and its manufacturing method, as well as a display device. The OLED display panel includes: a base substrate; and an organic light emitting unit, a pixel defining layer and a packaging substrate, arranged on the base substrate. The pixel defining layer is provided with a via hole at least one side of the organic light emitting unit. The via hole is filled with a total reflection-eliminating layer through which incident light is processed to obtain emergent light capable of arriving at an interface between the packaging substrate and an atmosphere at an incident angle smaller than a total reflection angle at the interface between the packaging substrate and the atmosphere.

20 Claims, 2 Drawing Sheets

(52) U.S. Cl.
CPC ...... *H01L 27/3248* (2013.01); *H01L 27/3258* (2013.01); *H01L 27/3262* (2013.01); *H01L 2227/323* (2013.01); *H01L 2251/301* (2013.01); *H01L 2251/303* (2013.01)

(56) References Cited

U.S. PATENT DOCUMENTS

| | | | |
|---|---|---|---|
| 2010/0148163 A1 | 6/2010 | Im et al. | |
| 2011/0255301 A1* | 10/2011 | Watanabe | G02F 1/13336 362/558 |
| 2015/0194634 A1* | 7/2015 | Kang | H01L 51/5268 257/40 |

FOREIGN PATENT DOCUMENTS

| | | |
|---|---|---|
| CN | 103915482 A | 7/2014 |
| JP | 2006165543 A | 6/2006 |
| KR | 20060000356 A | 1/2006 |

OTHER PUBLICATIONS

Written Opinion of the International Searching Authority for international application No. PCT/CN2014/092861.

* cited by examiner

ORGANIC LIGHT EMITTING DIODE DISPLAY PANEL AND ITS MANUFACTURING METHOD, DISPLAY DEVICE

CROSS-REFERENCE TO RELATED APPLICATION

This application claims is the U.S. national phase of PCT Application No. PCT/CN2014/092861 filed on Dec. 3, 2014, which a priority to Chinese Patent Application No. 201410454171.1 filed on Sep. 05, 2014, the disclosures of which are incorporated in their entirety by reference herein.

TECHNICAL FIELD

The present disclosure relates to the field of organic light emitting diode display technology, in particular to an organic light emitting diode display panel and its manufacturing method, as well as a display device.

BACKGROUND

An active matrix organic light emitting diode display panel attracts tremendous attentions and is becoming a mainstream display panel as its advantages such as being light, ultrathin and of a high contrast.

Referring to FIG. 1, a structural schematic view showing an organic light emitting diode (OLED) display panel in the related art, the OLED display panel includes: a base substrate 101, a buffer layer 102, an active layer 103, a gate insulating layer 104, a gate electrode 105, an interlayer insulating layer 106, a source/drain electrode 107, a passivation layer 108, a planarization layer 109, a first electrode 110, an organic light emitting layer 111, a second electrode 112, a pixel defining layer 113 and a glass packaging substrate 114.

In general, the OLED display panel in the related is of a low luminous efficiency, because that a light is totally reflected when entering an interface between the pixel defining layer 113 (being of a refractive index of about 1.8) and the glass packaging substrate 114 (being of a refractive index of about 1.5) and an interface between the glass packaging substrate 114 and an atmosphere (being of a refractive index of about 1) at an angle larger than the total reflection angle at the interface therebetween, as a result, about 20% in the total amount of emitting light emitting from the organic light emitting layer exits out and the rest light (about 80%) is restricted in the form of a guided wave inside the pixel defining layer 113 and the glass packaging substrate 114, which results in a decrease of the luminous efficiency.

Therefore, it is urgent to solve the technical problem to increase the luminous efficiency of the OLED display panel.

SUMMARY

Accordingly, an object of the present disclosure is to provide in embodiments an organic light emitting diode (OLED) display panel and its manufacturing method, as well as a display device, so as to solve the problem of the existing OLED display panel that the luminous efficiency is low.

In order to solve the above problem, the present disclosure provides in embodiments an organic light emitting diode (OLED) display panel, including:

a base substrate; and an organic light emitting unit, a pixel defining layer and a packaging substrate, arranged on the base substrate, wherein the pixel defining layer is provided with a via hole at at least one side of the organic light emitting unit, the via hole is filled with a total reflection-eliminating layer through which incident light is processed to obtain emergent light capable of arriving at an interface between the packaging substrate and an atmosphere at an incident angle smaller than a total reflection angle at the interface between the packaging substrate and the atmosphere.

Alternatively, the total reflection-eliminating layer includes:

a first light-processing layer being of a thickness larger than an organic light emitting layer of the organic light emitting unit, and a refractive index smaller than the pixel defining layer.

Alternatively, the first light-processing layer is made of magnesium fluoride, silicon dioxide or aluminium fluoride.

Alternatively, the first light-processing layer is manufactured by an evaporation or sputtering method.

Alternatively, the total reflection-eliminating layer further includes:

at least one second light-processing layer laminated on the first light-processing layer, and being of a refractive index larger than the first light-processing layer.

Alternatively, the total reflection-eliminating layer includes at least two second light-processing layers laminated on the first light-processing layer successively, and being of refractive indexes increasing successively in a direction away from the first light-processing layer.

Alternatively, the second light-processing layer is made of yttrium oxide, magnesium oxide, zirconium oxide, zinc sulfide, zinc selenide or titanium dioxide.

Alternatively, the second light-processing layer is manufactured by an evaporation or sputtering method.

Alternatively, the pixel defining layer is provided with via holes at both sides of the organic light emitting unit, and the via holes are filled with the total reflection-eliminating layer.

Alternatively, the organic light emitting unit includes: a first electrode, an organic light emitting layer and a second electrode.

Alternatively, the first electrode is arranged as an anode, and the second electrode is arranged as a cathode.

The present disclosure further provides in embodiments an organic light emitting diode (OLED) display device, which includes the above OLED display panel.

The present disclosure further provides in embodiments a method for manufacturing an organic light emitting diode (OLED) display panel, which includes steps of:

providing a base substrate;

forming a first electrode of an organic light emitting unit and a pixel defining layer on the base substrate;

forming a via hole in the pixel defining layer at at least one side of the organic light emitting unit;

filling the via hole with a total reflection-eliminating layer through which incident light is processed to obtain emergent light capable of arriving at an interface between a packaging substrate and an atmosphere at an incident angle smaller than a total reflection angle at the interface between the packaging substrate and the atmosphere; and forming an organic light emitting layer and a second electrode of the organic light emitting unit on the first electrode.

The present disclosure has the following beneficial effects. According to embodiment of the present disclosure, the pixel defining layer is provided with a via hole at at least one side of the organic light emitting unit, and the via hole is filled with a total reflection-eliminating layer through which incident light from the pixel defining layer is processed to obtain emergent light capable of arriving at an interface between a packaging substrate and an atmosphere at an incident angle smaller than a total reflection angle at the interface between the packaging substrate and the atmosphere, so as to reduce the total reflection, thereby to improve luminous efficiency of the OLED display panel. Further, it may avoid that the light emitting from the organic light emitting layers of adjacent subpixels is excited by each other which may result in a decrease of the service life of the organic light emitting layer.

DETAILED DESCRIPTION

Figure 1:
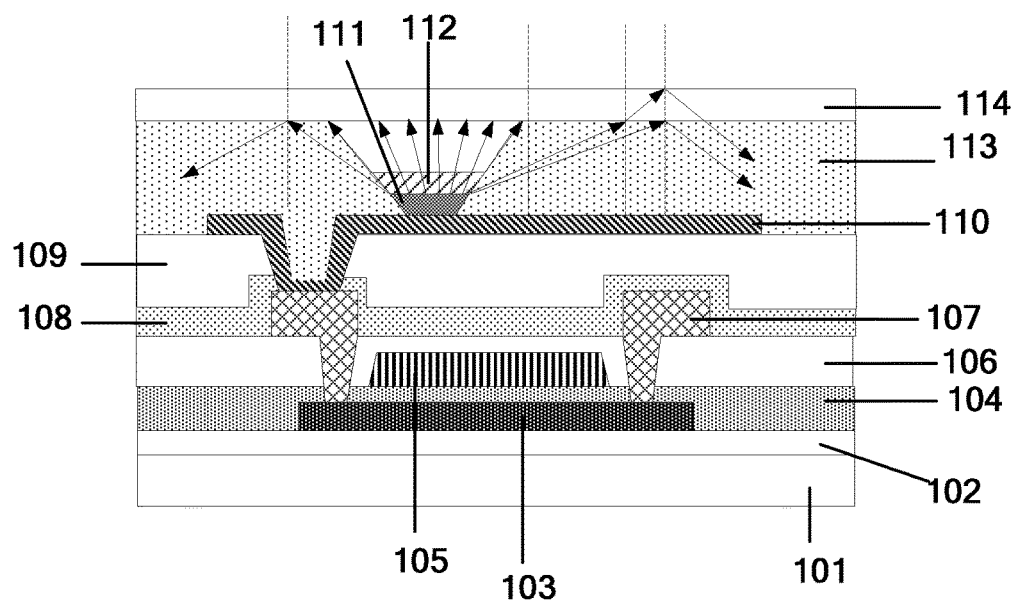
FIG. 1 is a structural schematic view showing an OLED display panel in the related art.

In order to make the objects, the technical solutions and the advantages of the present disclosure more apparent, the present disclosure will be described hereinafter in conjunction with the drawings and the embodiments.

The present disclosure provides in embodiments an organic light emitting diode (OLED) display panel, which includes a base substrate; and an organic light emitting unit, a pixel defining layer and a packaging substrate, arranged on the base substrate, wherein the pixel defining layer is provided with a via hole at at least one side of the organic light emitting unit. The via hole is filled with a total reflection-eliminating layer through which incident light is processed to obtain emergent light capable of arriving at an interface between the packaging substrate and an atmosphere at an incident angle smaller than the total reflection angle at the interface between the packaging substrate and the atmosphere.

The light emitting unit includes: a first electrode, an organic light emitting layer and a second electrode. Normally, the first electrode is arranged as an anode, and the second electrode is arranged as a cathode.

In general, the packaging substrate is a glass packaging substrate, with a refractive index of about 1.5. The refractive index of air is about 1.

Light is totally reflected when entering into an optically thinner medium being of a smaller refractive index from an optically denser medium being of a larger refractive index at an incident angle larger than the total reflection angle at the interface between the optically denser medium and the optically thinner medium, thereby decrease the luminous efficiency.

In another words, in an OLED display panel, light emitting from the organic light emitting layer of the organic light emitting unit usually enters the pixel defining layer at an incident angle which is usually large, as a result, the light may be totally reflected both at the interface between the pixel defining layer and the glass packaging substrate and the interface between the glass packaging substrate and the atmosphere, which leads to a decrease of luminous efficiency of the OLED display panel.

In order to improve the luminous efficiency, in an embodiment of the present disclosure, the pixel defining layer is provided with a via hole at at least one side of the organic light emitting unit, and the via hole is filled with a total reflection-eliminating layer through which incident light from the pixel defining layer is processed to obtain emergent light capable of arriving at the interface between the packaging substrate and the atmosphere at an incident angle smaller than a total reflection angle at the interface between the packaging substrate and the atmosphere, so as to reduce the total reflection, thereby to improve the luminous efficiency of the OLED display panel. Further, it may avoid that the light emitting from the organic light emitting layers of adjacent subpixels is excited by each other which may result in a decrease of the service life of the organic light emitting layer.

In embodiments of the present disclosure, the pixel defining layer may be provided with the via hole for filling the total reflection-eliminating layer merely at one side of the organic light emitting unit; or at both sides of the organic light emitting unit. It would be appreciated that setting via holes in the pixel defining layer at both sides of the organic light emitting unit may further improve the luminous efficiency of the OLED display panel, as compared with setting the via hole in the pixel defining layer merely at one side of the organic light emitting unit.

The structure of the total reflection-eliminating layer is described in details as follows.

The total reflection-eliminating layer may be of a single-layer structure, or a multilayer structure.

The total reflection-eliminating layer being of the single-layer structure may include: a first light-processing layer, being of a thickness larger than the organic light emitting layer of the organic light emitting unit, and a refractive index smaller than the pixel defining layer.

The first light-processing layer is of the thickness larger than the organic light emitting layer of the organic light emitting unit, so as to guarantee that the light emitting from the organic light emitting layer to the pixel defining layer can be processed by the first light-processing layer.

The first light-processing layer is of the refractive index smaller than the pixel defining layer, so that when light enters into the first light-processing layer from the pixel defining layer, an angle between the refracted light and the normal is larger than that between the incident light and the normal. The normal is perpendicular to an interface between the pixel defining layer and the first light-processing layer.

The first light-processing layer may be made of a material, such as magnesium fluoride, silicon dioxide and aluminum fluoride.

The total reflection-eliminating layer being of a multilayer structure may include:

a first light-processing layer, being of a thickness larger than the organic light emitting layer of the organic light emitting unit, and a refractive index smaller than the pixel defining layer;

at least one second light-processing layer laminated on the first light-processing layer, being of a refractive index larger than the first light-processing layer.

The first light-processing layer is of the refractive index smaller than the pixel defining layer, so that when the light enters into the first light-processing layer from the pixel defining layer, an angle between the refracted light and the normal is larger than that between the incident light and the normal The normal is perpendicular to an interface between the pixel defining layer and the first light-processing layer.

The second light-processing layer is of the refractive index larger than the first light-processing layer, so that when the light enters into the second light-processing layer from the first light-processing layer, an angle between the refracted light and the normal is smaller than that between the incident light and the normal. This normal is perpendicular to an interface between the first light-processing layer and the second light-processing layer.

The total reflection-eliminating layer may include one second light-processing layer, or a plurality of second light-processing layers. In the case that the total reflection-eliminating layer includes the plurality of the second light-processing layers, they are laminated on the first light-processing layer successively, and are of refractive indexes increasing successively in a direction away from the first light-processing layer, i.e., layers in the total reflection-eliminating layer are of refractive indexes changed in a gradient manner.

The second light-processing layer may be made of a material, such as yttrium oxide, magnesium oxide, zirconium oxide, zinc sulfide, zinc selenide and titanium dioxide.

The first light-processing layer and the second light-processing layer may be formed by an evaporation or sputtering method.

Figure 2:
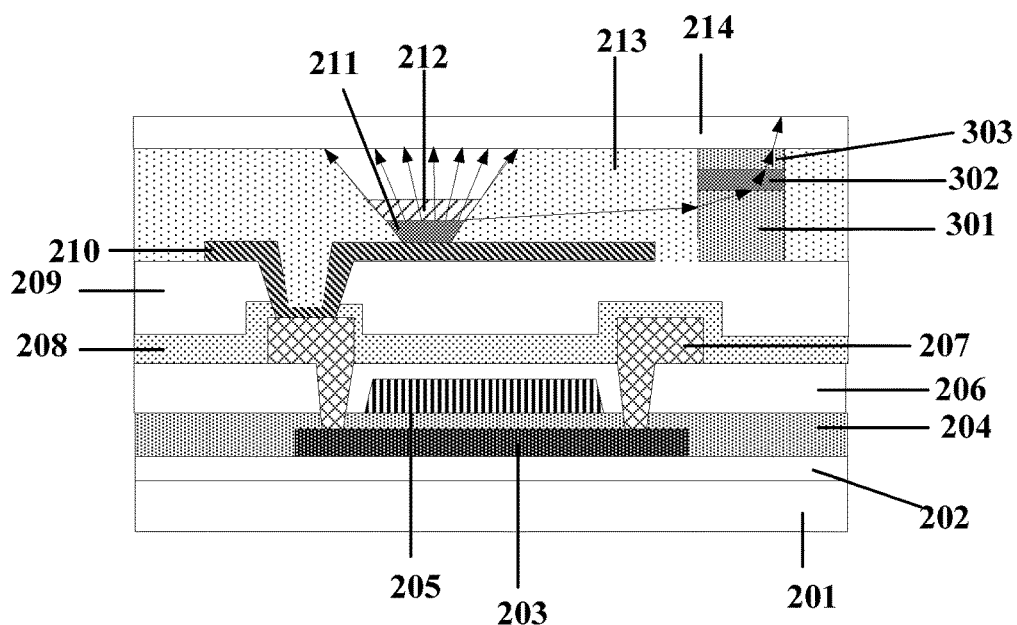
FIG. 2 is a structural schematic view showing an OLED display panel according to an embodiment of the present disclosure.

Referring to FIG. 2, a structural schematic view showing an OLED display panel according to an embodiment of the present disclosure. The OLED display play includes: a base substrate 201, a buffer layer 202, an active layer 203, a gate insulating layer 204, a gate electrode 205, an interlayer insulating layer 206, a source/drain electrode 207, a passivation layer 208, a planarization layer 209, a first electrode 210, an organic light emitting layer 211, a second electrode 212, a pixel defining layer 213 and a glass packaging substrate 214. The pixel defining layer 213 is provided with a via hole, and the via hole is filled with a total reflection-eliminating layer. The total reflection-eliminating layer includes: a first light-processing layer 301, a first second light-processing layer 302 and a second second light-processing layer 303. The total reflection-eliminating layer processes light entering into the total reflection-eliminating layer from the pixel defining layer, so as to obtain emergent light capable of arriving at an interface between the packaging substrate and an atmosphere at an incident angle smaller than a total reflection angle at the interface between the packaging substrate and the atmosphere.

The first light-processing layer 301 is of a refractive index smaller than the pixel defining layer 213. The first second light-processing layer 302 is of a refractive index larger than the first light-processing layer 301. The second second light-processing layer 303 is of a refractive index larger than the first second light-processing layer 302.

A situation is assumed that the pixel defining layer 213 is of a refractive index n1 of 1.8, the first light-processing layer 301 is of a refractive index n2 of 1.1, the first second light-processing layer 302 is of a refractive index n3 of 1.7, and the second second light-processing layer 303 is of a refractive index n4 of 1.75; an angle (i.e., incident angle) between a first normal S1 and incident light entering the first light-processing layer 301 from the pixel defining layer 213 is $\angle 1$, an angle (i.e., refraction angle) between the first normal S1 and refracted light is $\angle 2$, and the first normal S1 is perpendicular to an interface between the pixel defining layer 213 and the first light-processing layer 301.

Figure 3:
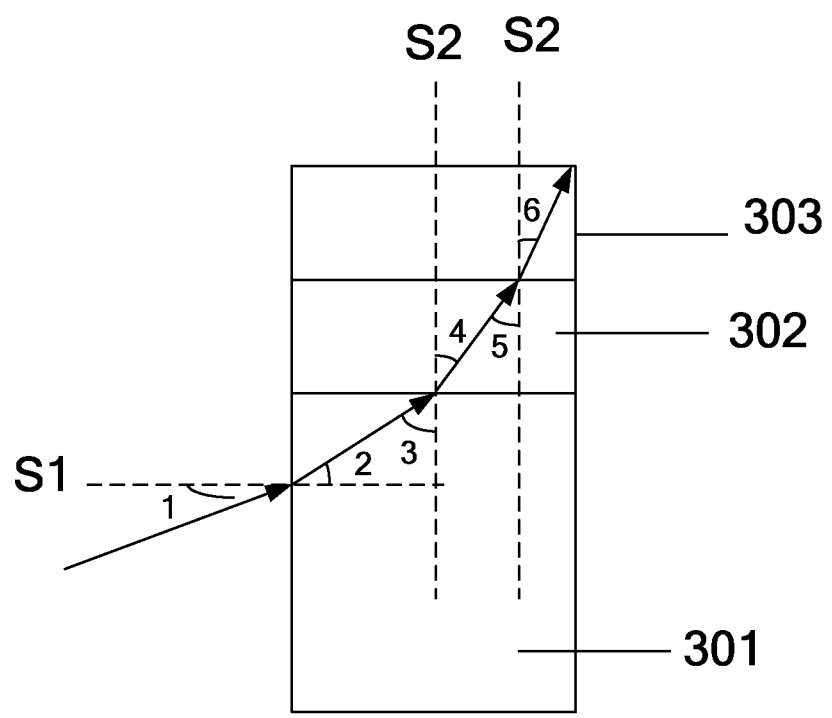
FIG. 3 is a diagram showing a light path in a total reflection-eliminating layer according to an embodiment of the present disclosure.

Referring to FIG. 3, a schematic diagram showing a light path in a total reflection-eliminating layer according to an embodiment of the present disclosure, an angle (i.e., incident angle) between second surface S2 and incident light entering the first second light-processing layer 302 from the first light-processing layer 301 is $\angle 3$, an angle (i.e., refraction angle) between the second normal S2 and refracted light is $\angle 4$, an angle (i.e., incident angle) between the second normal S2 and incident light entering the second second light-processing layer 303 from the first second light-processing layer 302 is $\angle 5$, and an angle (i.e., refraction angle) between the second normal S2 and refracted light is $\angle 6$. The second normal S2 is perpendicular to an interface between the packaging substrate and the atmosphere.

According to a refractive index formula of $n \times \sin \angle \alpha = n' \times \sin \angle \beta$, in which n and n' are refractive indexes of two mediums, respectively, $\angle \alpha$ is an incident angle and $\angle \beta$ is a refraction angle.

Therefore, when light enters the first light-processing layer (n2=1.1) from the pixel defining layer 213 (n1=1.8), the refraction angle $\angle 2$ is larger than the incident angle $\angle 1$, so that an angle (i.e., $\angle 3$ which is the coangle of $\angle 2$) between refracted light and the second normal S2 is smaller than an angle between incident light and the second normal S2, thereby enable the refracted light to be closer to the second normal.

When light enters the first second light-processing layer (n3=1.7) from the first light-processing layer (n2=1.1), the refraction angle $\angle 4$ is smaller than the incident angle $\angle 3$, thereby enable the refracted light to be more closer to the second normal.

When light enters the second second light-processing layer 303 (n4=1.75) from the first second light-processing layer 302 (n3=1.7), the refraction angle $\angle 6$ is smaller than the incident angle $\angle 5$, thereby enable the refracted light to be more closer to the second normal.

Finally, it may enable the light arriving at the interface between the packaging substrate and the atmosphere at an incident angle smaller than the total reflection angle at the interface between the packaging substrate and the atmosphere, so as to reduce the total reflection, thereby to improve luminous efficiency.

The present disclosure further provides in embodiments an organic light emitting diode (OLED) display device, which includes the above OLED display panel.

The present disclosure further provides in embodiments a method for manufacturing an organic light emitting diode (OLED) display panel, which includes steps of:

providing a base substrate;

forming a first electrode and a pixel defining layer on the base substrate;

forming a via hole in the pixel defining layer at at least one side of an organic light emitting unit, specifically, the via hole may be formed by an exposure method; and filling the via hole with a total reflection-eliminating layer, by which incident light is processed to obtain emergent light capable of arriving at an interface between a packaging substrate and atmosphere at an incident angle smaller than a total reflection angle at the interface between the packaging substrate and the atmosphere, specifically, the total reflection-eliminating layer may be formed by an evaporation method.

The above are merely the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. An organic light emitting diode (OLED) display panel, comprising:
   a base substrate; and
   an organic light emitting unit, a pixel defining layer and a packaging substrate, arranged on the base substrate,
   wherein the pixel defining layer is provided with a via hole at least one side of the organic light emitting unit,
   the via hole is filled with a total reflection-eliminating layer through which incident light is processed to obtain emergent light capable of arriving at an interface between the packaging substrate and an atmosphere at an incident angle smaller than a total reflection angle at the interface between the packaging substrate and the atmosphere,
   wherein the total reflection-eliminating layer comprises a plurality of light-processing layers being of refractive indexes increasing successively in a direction towards the packaging substrate.

2. The OLED display panel according to claim 1, wherein the plurality of light-processing layers comprise:
   a first light-processing layer, arranged on bottom side of via hole, being of a thickness larger than an organic light emitting layer of the organic light emitting unit, and a refractive index smaller than the pixel defining layer.

3. The OLED display panel according to claim 2, wherein the pixel defining layer is provided with via holes at both sides of the organic light emitting unit, and the via holes are filled with the total reflection-eliminating layer.

4. The OLED display panel according to claim 2, wherein the first light-processing layer is made of magnesium fluoride, silicon dioxide or aluminium fluoride.

5. The OLED display panel according to claim 2, wherein the first light-processing layer is manufactured by an evaporation or sputtering method.

6. The OLED display panel according to claim 2, wherein the plurality of light-processing layers further comprise:
   at least one second light-processing layer, laminated on the first light-processing layer, and being of a refractive index larger than the first light-processing layer.

7. The OLED display panel according to claim 6, wherein the at least one second light-processing layer is made of yttrium oxide, magnesium oxide, zirconium oxide, zinc sulfide, zinc selenide or titanium dioxide.

8. The OLED display panel according to claim 6, wherein the at least one second light-processing layer is manufactured by an evaporation or sputtering method.

9. The OLED display panel according to claim 6, wherein the pixel defining layer is provided with via holes at both sides of the organic light emitting unit, and the via holes are filled with the total reflection-eliminating layer.

10. The OLED display panel according to claim 4, wherein the plurality of light-processing layers further comprise:
    at least one second light-processing layer, laminated on the first light-processing layer, and being of a refractive index larger than the first light-processing layer.

11. The OLED display panel according to claim 1, wherein the pixel defining layer is provided with via holes at both sides of the organic light emitting unit, and the via holes are filled with the total reflection-eliminating layer.

12. The OLED display panel according to claim 1, wherein the organic light emitting unit comprises: a first electrode, an organic light emitting layer and a second electrode.

13. The OLED display panel according to claim 12, wherein the first electrode is arranged as an anode, and the second electrode is arranged as a cathode.

14. An organic light emitting diode (OLED) display device, comprising the OLED display panel according to claim 1.

15. The OLED display device according to claim 14, wherein the plurality of light-processing layers comprise:
    a first light-processing layer being of a thickness larger than an organic light emitting layer of the organic light emitting unit, and a refractive index smaller than the pixel defining layer.

16. The OLED display device according to claim 14, wherein the plurality of light-processing layers further comprise:
    at least one second light-processing layer, laminated on the first light-processing layer, and being of a refractive index larger than the first light-processing layer.

17. The OLED display device according to claim 14, wherein the pixel defining layer is provided with via holes at both sides of the organic light emitting unit, and the via holes are filled with the total reflection-eliminating layer.

18. The OLED display panel according to claim 1, wherein the via hole has a uniform internal diameter.

19. A method for manufacturing an organic light emitting diode (OLED)display panel, comprising steps of:
    providing a base substrate;
    forming a first electrode of an organic light emitting unit and a pixel defining layer on the base substrate;
    forming a via hole in the pixel defining layer at least one side of the organic light emitting unit;
    filling the via hole with a total reflection-eliminating layer through which incident light is processed to obtain emergent light capable of arriving at an interface between a packaging substrate and an atmosphere at an incident angle smaller than a total reflection angle at the interface between the packaging substrate and the atmosphere, wherein the total reflection-eliminating layer comprises a plurality of light-processing layers being of refractive indexes increasing successively in a direction towards the packaging substrate; and
    forming an organic light emitting layer and a second electrode of the organic light emitting unit above the first electrode.

20. The method according to claim19, wherein the via hole has a uniform internal diameter.

* * * * *